United States Patent
Tseng et al.

(10) Patent No.: US 7,903,470 B2
(45) Date of Patent: Mar. 8, 2011

(54) INTEGRATED CIRCUITS AND DISCHARGE CIRCUITS

(75) Inventors: Te-Chang Tseng, Jhubei (TW); Chun-Yi Tu, Hsinchu (TW); Hideki Arakawa, Yokohama (JP); Yamasaki Kyoji, Takarazuka (JP)

(73) Assignee: Powerchip Semiconductor Corp., Hsin-Chu (TW)

( * ) Notice: Subject to any disclaimer, the term of this patent is extended or adjusted under 35 U.S.C. 154(b) by 207 days.

(21) Appl. No.: 12/335,189

(22) Filed: Dec. 15, 2008

(65) Prior Publication Data

US 2009/0161440 A1    Jun. 25, 2009

(30) Foreign Application Priority Data

Dec. 19, 2007    (TW) ............................... 96148594 A

(51) Int. Cl.
*G11C 11/34* (2006.01)
*G11C 16/06* (2006.01)
(52) U.S. Cl. ............................... 365/185.25; 365/185.29
(58) Field of Classification Search ............. 365/185.25, 365/185.29, 185.18, 185.2
See application file for complete search history.

(56) References Cited

U.S. PATENT DOCUMENTS

| | | | | |
|---|---|---|---|---|
| 5,740,109 A | * | 4/1998 | Morton et al. | 365/185.18 |
| 6,667,910 B2 | * | 12/2003 | Abedifard et al. | 365/185.29 |
| 7,411,835 B2 | * | 8/2008 | Darrer | 365/185.25 |
| 7,738,299 B2 | * | 6/2010 | Kuriyama et al. | 365/185.18 |

* cited by examiner

*Primary Examiner* — Anh Phung
(74) *Attorney, Agent, or Firm* — Muncy, Geissler, Olds & Lowe, PLLC

(57) ABSTRACT

An integrated circuit is provided. The integrated circuit includes a memory device and a discharge circuit. The discharge circuit discharges the well voltage line and the first voltage line of the memory device after the end of the erasing period and includes a first and second switch circuit and a first and second control voltage supplier. The first switch circuit is coupled between the well voltage line, the first voltage line and a second supplier. The second switch circuit is coupled between the first switch circuit and a reference voltage. The first control voltage supplier is coupled to the first switch circuit and supplies a first control voltage to turn on the first switch circuit during a first discharge period. The second control voltage supplier is coupled to the second switch circuit, and supplies a second control voltage to turn on the second switch circuit during a second discharge period.

23 Claims, 8 Drawing Sheets

US 7,903,470 B2

INTEGRATED CIRCUITS AND DISCHARGE CIRCUITS

CROSS REFERENCE TO RELATED APPLICATIONS

This Application claims priority of Taiwan Patent Application No. TW96148594, filed on Dec. 19, 2007 the entirety of which is incorporated by reference herein.

BACKGROUND OF THE INVENTION

1. Field of the Invention

The invention relates to a discharge circuit, and more particularly to a discharge circuit of a flash memory.

2. Description of the Related Art

Recently, flash memory has been commonly used in ultra large scale integration (ULSI) circuits. Flash memory is a sort of nonvolatile memory, which is characterized by permanently keeping stored data even when power is not supplied. The characteristic is similar to a hard disc. Among the non-volatile memories, since the flash memory has high speed, high density, in-system reprogramming ability and so on, it is the basic storage media in portable digital electronic devices. The general high speed six-transistor static random access memory (6T SRAM) requires six transistors to form one memory cell, and the high speed dynamic random access memory (DRAM) also requires the area of about four transistor elements for one memory cell. On the contrary, flash memory requires only one element to represent a single memory cell, thus having extremely high density. In addition, since the flash memory adopts a stacked-gate MOSFET structure, the process can also be greatly simplified. Therefore, flash memory is the preferred choice for storage media in portable digital electronic devices or large data storage media. The flash memory is especially commonly used for voice signal processing in mobile phones and video data processing in personal digital assistants.

Flash memory can be grouped into NAND flash and NOR flash. The memory cell of a NAND flash is structured in serial and the writing and reading of the memory cell is processed by pages and blocks, where one page contains several bits, and one block contains several pages. Typical block sizes are 8~32 KB. The advantage of the serial structure is that the memory size may be made large, thus, the memory size of a NAND flash generally exceeds 512 MB. Also, NAND flash is now being commonly used because of its low cost. The memory cell of a NOR flash is structured in parallel and thus, the transmission of the input/output port of the NOR flash is faster than the NAND flash. Due to the parallel transmission mode, reading in the NOR flash is faster than in the NAND flash. NAND flash is greatly used in portable storage devices, digital cameras, MP3 players, personal digital assistants, and so on.

FIG. 1 shows the cross-sectional view of a flash memory 10. As shown in FIG. 1, the label P_sub stands for the substrate, the labels P_well and LV_P well stand for the P well, and the label N_well stands for the N well. The flash memory 10 includes a memory cell, a selection transistor, and multiple voltage lines providing voltage to operate the flash memory. The label WL stands for the word line, and the label BL stands for the bit line connected between the memory cell and selection transistor. The selection voltage line SL is connected to the memory cell, and the P well voltage line VPW is connected to the P well of the memory cell. The voltage line YBL is connected to the gage of the selection transistor, and the voltage line Virpwr is also connected to the selection transistor.

FIG. 2 shows the conventional voltage on each voltage line when erasing of the flash memory. As shown in FIG. 2, during the time interval A, an external voltage source (not shown) supplies an erasion voltage Verase to the voltage line VPW to provide a logic high voltage to the P well. Thus, the electrons in the written floating gate (FG as shown in FIG. 1) can be sucked back to the P_well along the direction as shown in the arrows of FIG. 1, so as to erase the written data in the flash memory 10. The described operation is called the F-N tunneling to erase the stored data in the flash memory. During the time interval A, the selection voltage line SL, bit line BL, and voltage lines YBL and Virpwr are all floating, and thus, will be coupled to a voltage smaller than that of the voltage line VPW. For example, as shown in the figure, when the 20V erasion voltage Verase is supplied to the voltage line VPW, the voltages on SL, BL, YBL and Virpwr are coupled to the voltages smaller than 20V to sustain appropriate operations of the flash memory. When the data is completely erased, the voltage lines begin to discharge during time interval B. However, since the discharge speed of each element in the flash memory is different, the remaining voltage on each element may be different and therefore conducting the PN junction and causing a large current which may damage the flash memory.

Therefore, an improved discharge circuit to adequately control the discharge procedure of each voltage line for discharging at the same time and achieving stable voltages is highly desired.

BRIEF SUMMARY OF THE INVENTION

An integrated circuit and discharge circuit are provided. An exemplary embodiment of such an integrated circuit comprises a memory device and a discharge circuit. The memory device comprises a memory cell, a well voltage line coupled to a well of the memory device, a first voltage line coupled to a first first node of the memory cell and a first supplier supplying a first voltage to the well voltage line and coupling a coupled voltage on the first voltage line during an erasing period. The discharge circuit discharges the well voltage line and the first voltage line after the end of the erasing period and comprises a first and second switch circuit and a first and second control voltage supplier. The first switch circuit is coupled between the well voltage line, the first voltage line and a second supplier. The second supplier supplies a second voltage smaller than the first voltage and the coupled voltage. The second switch circuit is coupled between the first switch circuit and a reference voltage. The reference voltage is smaller than the first voltage. The first control voltage supplier is coupled to the first switch circuit and supplies a first control voltage to turn on the first switch circuit during a first discharge period so as to couple the well voltage line and the first voltage line to the second supplier. The second control voltage supplier is coupled to the second switch circuit, and supplies a second control voltage to turn on the second switch circuit during a second discharge period so as to couple the well voltage line and the first voltage line to the reference voltage.

An exemplary embodiment of a discharge circuit discharging a plurality voltage lines in a memory device is provided, wherein the voltage lines comprise a well voltage line coupled to a well of the memory device and a first voltage line coupled to a first first node of a memory cell of the memory device, wherein the memory device further comprises a first supplier supplying a first voltage high enough to erase data stored in the memory cell to the well voltage line and coupling a coupled voltage on the first voltage line during an erasing period. The discharge circuit comprises a preparing circuit, a first stage discharge circuit and a second stage discharge circuit. The preparing circuit comprises a second supplier, a first switch circuit coupled to the second supplier, a capacitor coupled to a reference voltage, and a second switch circuit coupled between the first switch circuit and the capacitor, wherein the second supplier supplies a second voltage to the first switch circuit, and the first switch circuit and the second switch circuit are turned on during a preparing period to charge the capacitor to the second voltage. The first stage discharge circuit comprises a third switch circuit coupled to the well voltage line and the first voltage line, wherein the third switch circuit, the first switch circuit and the second switch circuit are coupled at a connection node, and the third switch circuit is turned on during a first discharge period to couple the well voltage line and the first voltage line to the connection node. The second stage discharge circuit comprises a fourth switch circuit coupled to the capacitor and the reference voltage, wherein the fourth switch circuit is turned on during a second discharge period to couple the connection node to the reference voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
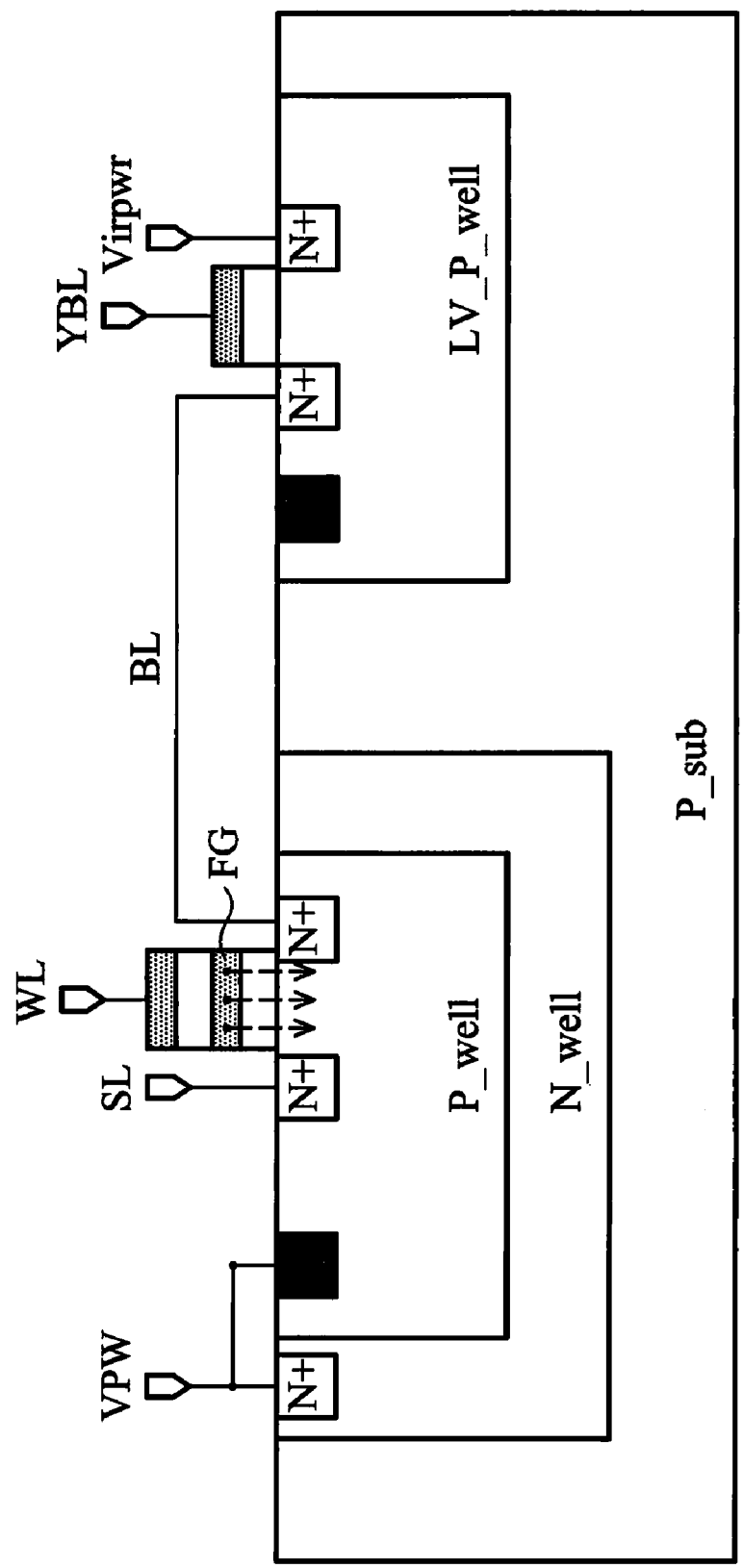
FIG. 1 shows the cross-sectional view of a flash memory device.
Figure 2:
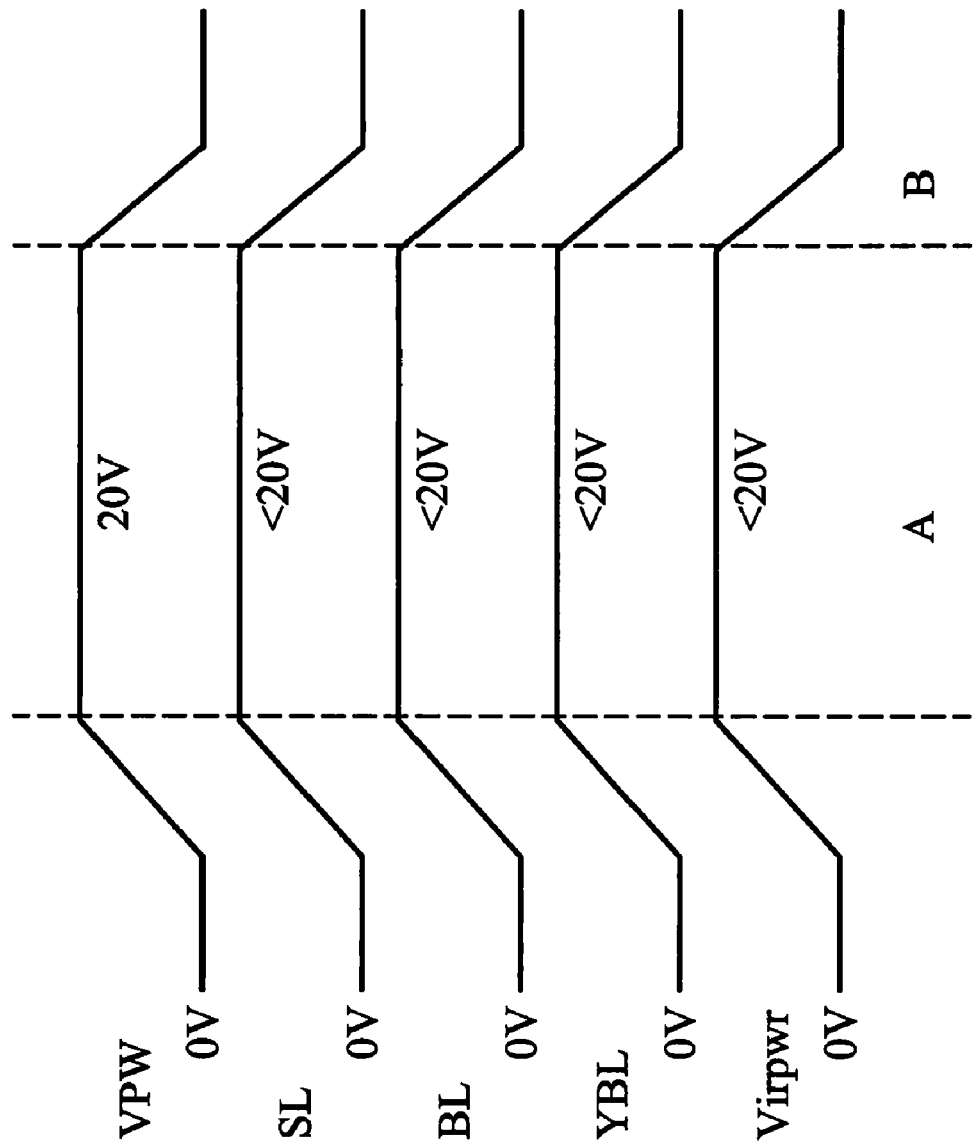
FIG. 2 shows the conventional voltage on each voltage line when erasing of the flash memory.
Figure 3:
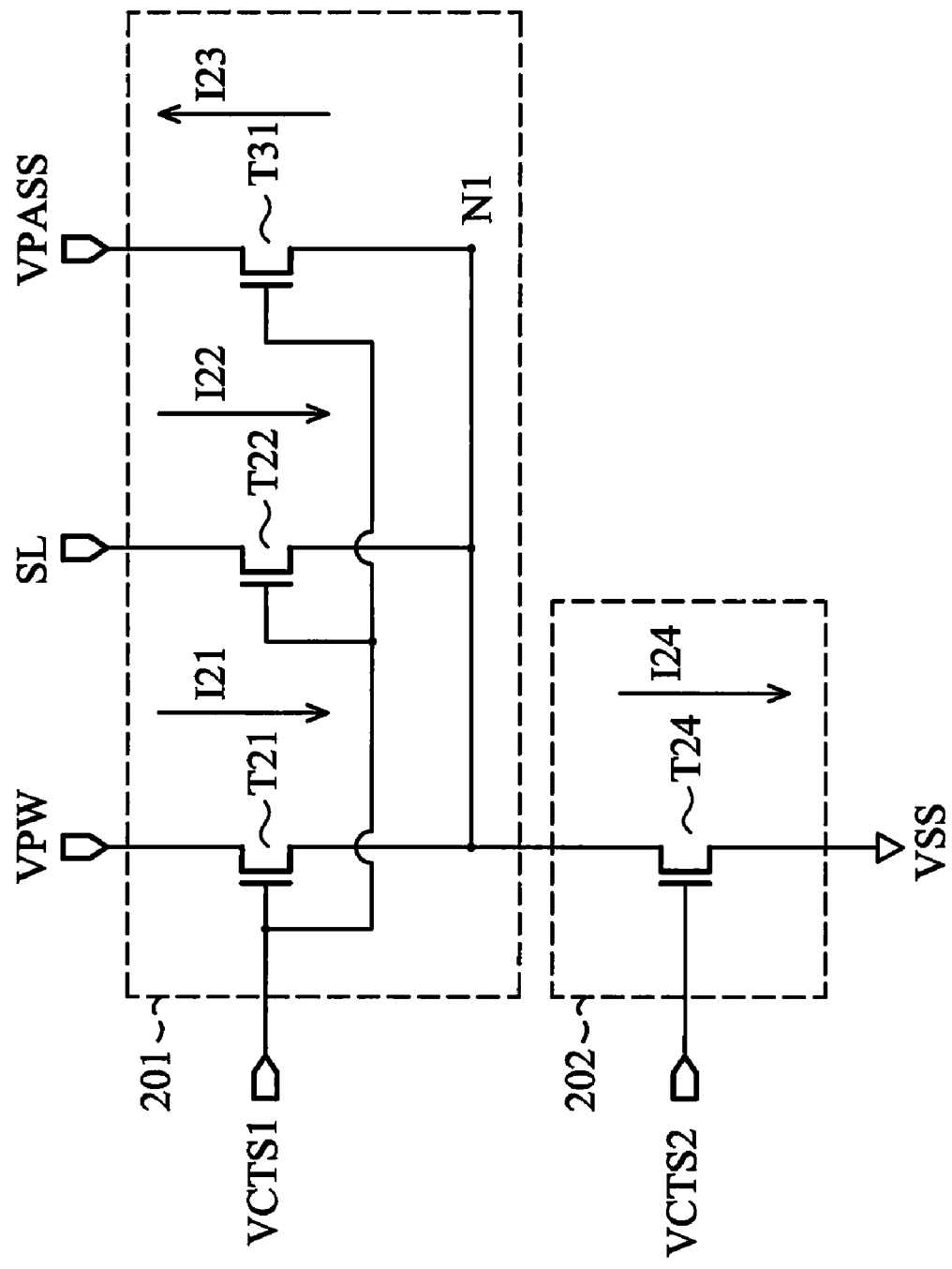
FIG. 3 shows a discharge circuit according an embodiment of the invention.

FIG. 3 shows a discharge circuit 20 according an embodiment of the invention. The discharge circuit 20 may be used in the memory device as shown in FIG. 1 to discharge the erasion voltage V_erase on the well voltage line VPW and the coupled voltage V_couple on the selection voltage line SL after erasing the data stored in the memory device. The discharge circuit 20 comprises switch circuits 201 and 202, supplier VPASS and control voltage suppliers VCTS1 and VCTS2. As shown in FIG. 3, the switch circuit 201 is coupled between the well voltage line VPW, the selection voltage line SL and supplier VPASS. The supplier VPASS supplies a voltage smaller than the erasion voltage V_erase and the coupled voltage V_couple. The switch circuit 202 is coupled between the switch circuit 201 and a reference voltage VSS. According to an embodiment of the invention, the reference voltage VSS may be the ground. The control voltage suppliers VCTS1 is coupled to the switch circuit 201 and supplies a control voltage V_ctrl1 to turn on the switch circuit 201 during a first discharge period so as to couple the well voltage line VPW and the selection voltage line SL to the supplier VPASS. The control voltage supplier VCTS2 is coupled to the switch circuit 202 and supplies the control voltage V_ctrl2 to turn on the switch circuit 202 during a second discharge period so as to couple the well voltage line VPW and the selection voltage line SL to the reference voltage VSS.

As shown in FIG. 3, the switch circuit 201 comprises transistors T21, T22 and T23. The transistor T21 is coupled to the well voltage line VPW. The transistor T22 is coupled to the selection voltage line SL. The transistor T23 is coupled to the supplier VPASS. The gates of the transistors T21, T22 and T23 are respectively coupled to the control voltage supplier VCTS1, and the switch circuit 202 and the transistors T21, T22 and T23 are coupled at a connection node N1. The switch circuit 202 may be a transistor T24 coupled between the connection node N1 and the reference voltage VSS, and comprise a gate coupled to the control voltage supplier VCTS2. According to an embodiment of the invention, the control voltage supplier VCTS1 may also supply voltage to the voltage line YBL as shown in FIG. 1, and couple the connection node N1 to the voltage line Virpwr to discharge the coupled voltages on the voltage line Virpwr and bit line BL via the discharge operation of the discharge circuit 20. During the first discharge period of the discharge circuit 20, since the control voltage supplier VCTS1 supplies a control voltage V_ctrl1 high enough to turn on the transistors T21, T22 and T23, and the supplier VPASS supplies a voltage V_pass smaller than the erasion voltage V_erase on the well voltage line VPW and the coupled voltage V_couple on the selection voltage line SL, the current I21 may be generated to flow from the well voltage line VPW to the connection node N1 and the current I22 may be generated to flow from the selection voltage line SL to the connection node N1. The currents I21 and I22 may further flow from the connection node N1 to the supplier VPASS to form the current I23. In this manner, the voltages on the well voltage line VPW, the selection voltage line SL and the voltage line Virpwr may be discharged to a voltage substantially equal to the voltage V_pass during the first discharge period. During the second discharge period of the discharge circuit 20, since the control voltage supplier VCTS2 supplies a control voltage V_ctrl2 high enough to turn on the transistor T24, the current I24 may be generated to flow from the connection node N1 to the reference voltage VSS. In this manner, the voltages on the well voltage line VPW, the selection voltage line SL and the voltage line Virpwr may be further discharged to a voltage substantially equal to the reference voltage VSS during the second discharge period.

Figure 4:
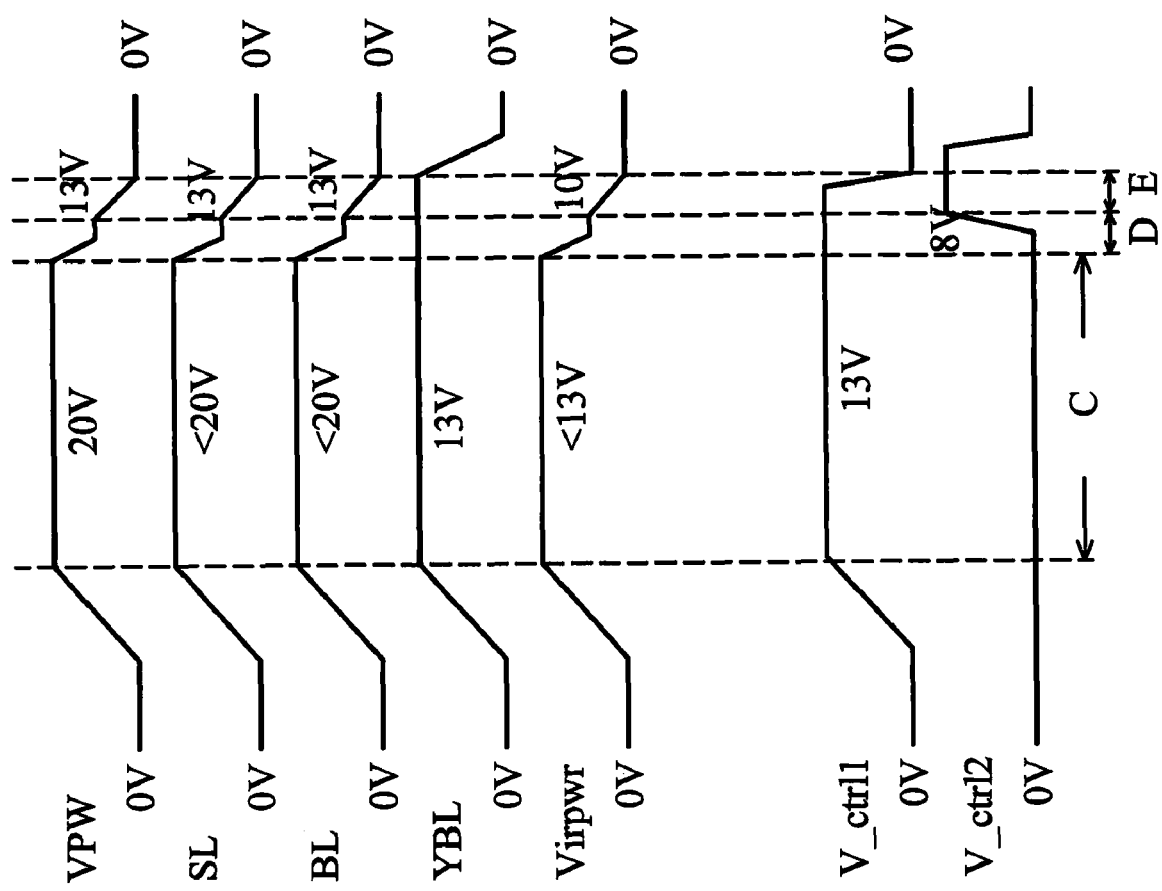
FIG. 4 shows the voltages on each voltage line of the memory device during the data erasion period and the discharge period.

FIG. 4 shows the voltages on each voltage line of the memory device during the data erasion period and the discharge period by using the discharge circuit 20 as shown in FIG. 3. As shown in the figure, the time interval C represents the erasion period, and the time interval D and E respectively represents the first and second discharge period. In this embodiment, the erasion voltage applied to the well voltage line VPW is about 20V, the voltage applied to the voltage line YBL is about 13V, and voltages smaller than 20V and smaller than 13V are respectively coupled on the selection voltage line SL, the bit line BL and the voltage line Virpwr. The values of the voltages have been described by way of examples and in terms of preferred embodiments, however it is to be understood that the invention is not limited thereto. The scope of the present invention shall be defined and protected by the following claims and their equivalents. As shown in FIG. 4, the control voltage V_ctrl1 remains at a logic high voltage during the time interval D so as to turn on the transistors T21, T22 and T23, such that the voltages on the well voltage line VPW, the selection voltage line SL and the bit line BL may be discharged to a voltage substantially equal to the supplying voltage V_pass (13V in this embodiment) of the supplier VPASS. Because the voltage line Virpwr is coupled to the connection node N1, the voltage on the voltage line Virpwr may be discharged to a voltage (10V in this embodiment) substantially equal to the voltage V_pass subtracted by the threshold voltage of the transistor T23. During the time interval E, the control voltages V_ctrl1 and V_ctrl2 remain at a logic high voltage such that the voltages on the well voltage line VPW, the selection voltage line SL, the bit line BL and the voltage line Virpwr may be further discharged to the reference voltage VSS. In this embodiment of the invention, the reference voltage VSS may be ground. Thus, during the time interval E, the voltages on the well voltage line VPW, the selection voltage line SL, the bit line BL and the voltage line Virpwr may be further discharged to about 0V to finish the discharge of each voltage line of the memory device. According to the embodiment of the invention, the control voltage V_ctrl1 may remain at 8V~17V for a logic high voltage, or may be selected as half of the erasion voltage of the memory device for a logic high voltage.

Figure 5:
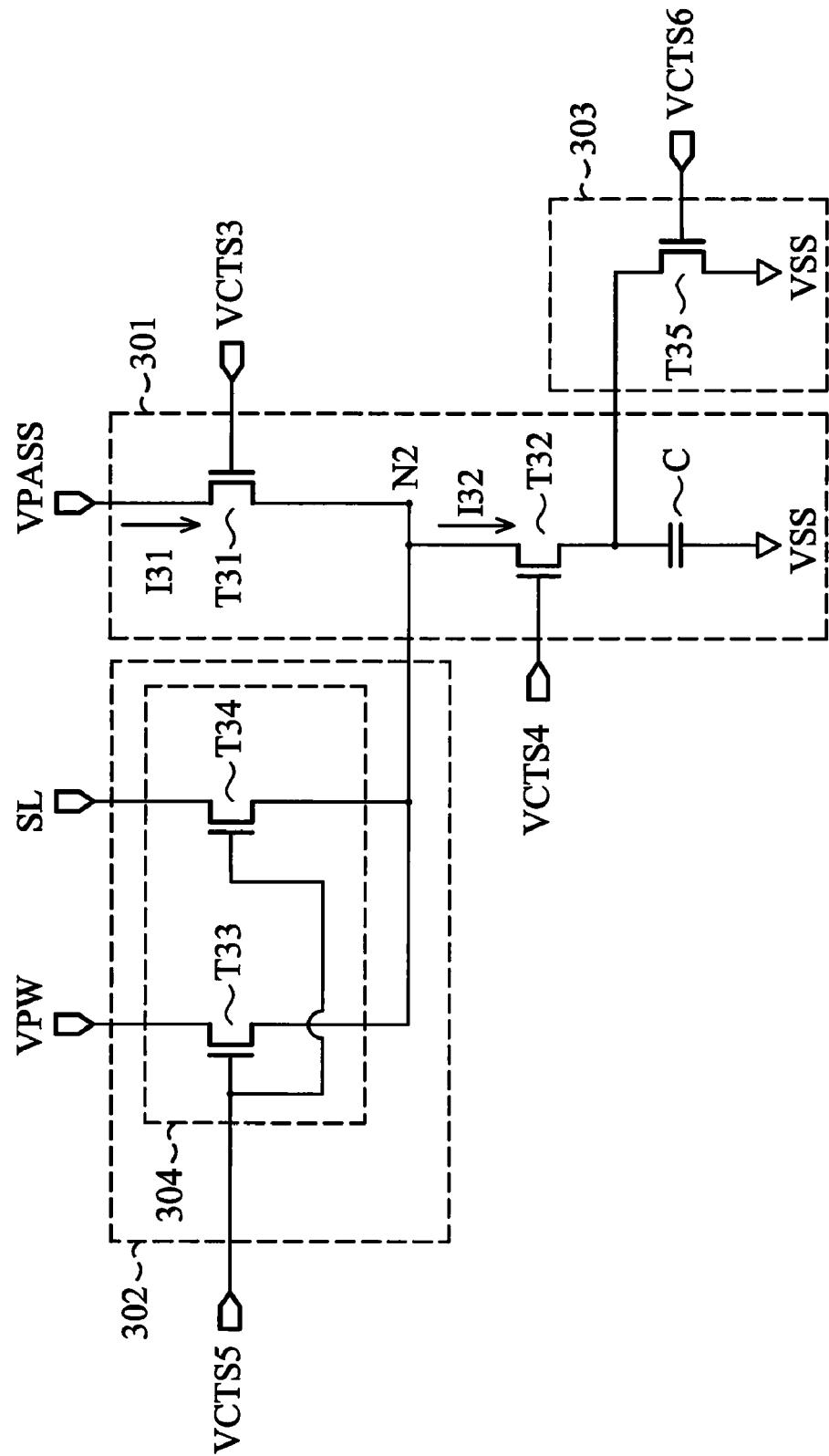
FIG. 5 shows a discharge circuit according to another embodiment of the invention.

FIG. 5 shows a discharge circuit 30 according to another embodiment of the invention. The discharge circuit 30 may be used in the memory device as shown in FIG. 1 to discharge the erasion voltage V_erase on the well voltage line VPW and the coupled voltage V_couple on the selection voltage line SL after erasing the data stored in the memory device. As shown in FIG. 5, the discharge circuit 30 comprises a preparing circuit 301, a first stage discharge circuit 302 and a second stage discharge circuit 303. The preparing circuit 301 comprises a supplier VPASS, a transistor T31 coupled to the supplier VPASS, a capacitor C coupled to a reference voltage VSS, and a transistor T32 coupled between the transistor T31 and the capacitor C, wherein the supplier VPASS supplies a voltage V_pass smaller than the erasion voltage V_erase and coupled voltage V_couple to the transistor T31, and the transistors T31 and T32 are turned on during a preparing period to charge the capacitor C to the voltage V_pass. The first stage discharge circuit 302 comprises a switch circuit 304 coupled to the well voltage line VPW and the selection voltage line SL. The switch circuit 304 and the transistors T31 and T32 are coupled at a connection node N2, and the switch circuit 304 is turned on during a first discharge period to couple the well voltage line VPW and the selection voltage line SL to the connection node N2. The second stage discharge circuit 303 comprises a transistor T35 coupled between the capacitor C and the reference voltage VSS. The transistor T35 is turned on during a second discharge period to couple the connection node N2 to the reference voltage VSS.

As shown in FIG. 5, the transistor T31 of the preparing circuit 301 comprises a gate coupled to a control voltage supplier VCTS3, and the transistor T32 comprises a gate coupled to a control voltage supplier VCTS4. The control voltage suppliers VCTS3 and VCTS4 respectively supply control voltages V_ctrl3 and V_ctrl4 to turn on the transistors T31 and T32 to turn on during the preparing period. The switch circuit 304 of the first stage discharge circuit 302 comprises transistors T33 and T34. The transistor T33 comprises a gate coupled to a control voltage supplier VCTS5. The transistor T34 comprises a gate coupled to the control voltage supplier VCTS5. The transistors T31, T32, T33 and T34 are coupled to the connection node N2. The control voltage supplier VCTS5 supplies a control voltage V_ctrl5 to turn on the transistors T33 and T34 during the first discharge period. The transistor T35 of the second stage discharge circuit 303 comprises a gate coupled to a control voltage supplier VCTS6. The control voltage supplier VCTS6 supplies a control voltage V_ctrl6 to turn on the transistor T35 during the second discharge period. According to the embodiment of the invention, the control voltage supplier VCTS5 also supplies voltage to the voltage line YBL as shown in FIG. 1 and connects the connection node N2 to the voltage line Virpwr to discharge coupled voltage on the voltage line Virpwr and bit line BL via the discharge circuit 30.

Figure 6:
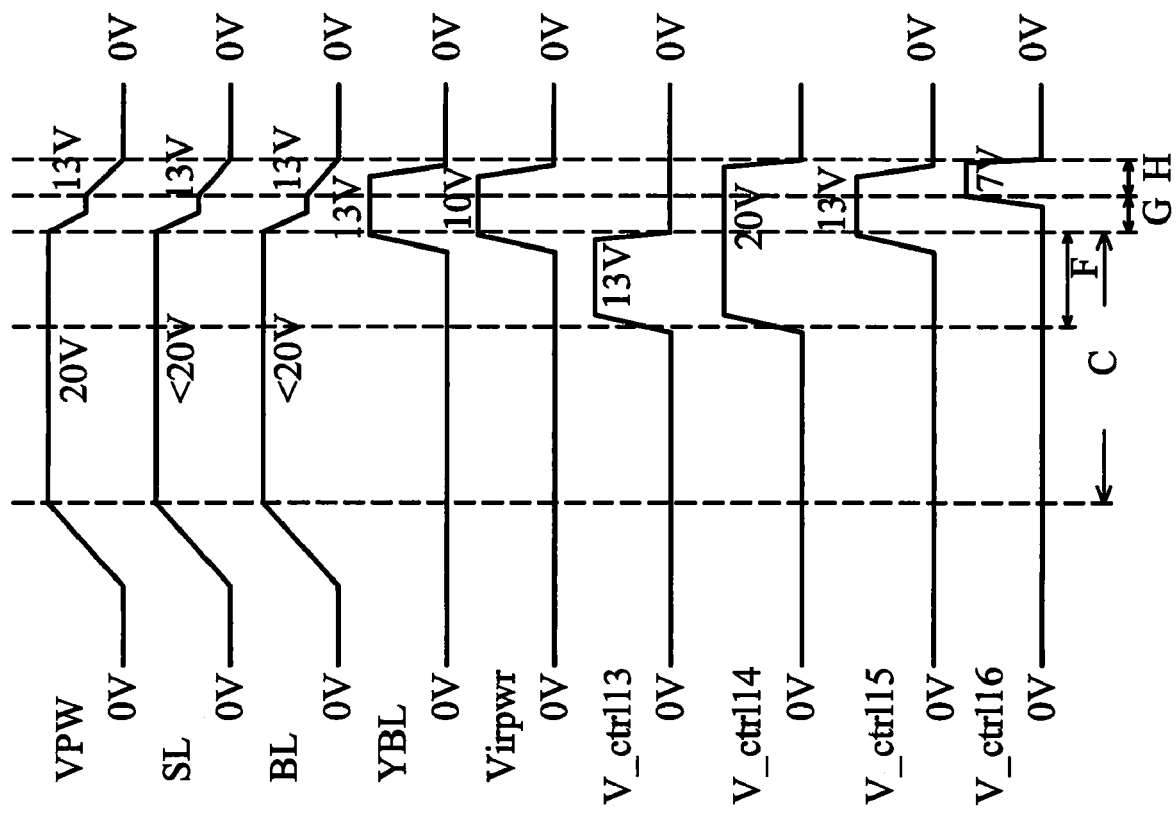
FIG. 6 shows the voltages on each voltage line of the memory device during the data erasion period and the discharge period.

FIG. 6 shows the voltages on each voltage line of the memory device during the data erasion period and the discharge period by using the discharge circuit 30 as shown in FIG. 5. The time interval C represents the erasion period, the time interval F represents the preparing period, and the time interval G and H respectively represents the first and second discharge period. As shown in the figure, the control voltage V_ctrl3 remains at a logic high voltage during the preparing period F and remains at a logic low voltage during the first discharge period G and second discharge period H. The control voltage V_ctrl4 remains at a logic high voltage during the preparing period F, the first discharge period G and second discharge period H. The control voltage V_ctrl5 remains at a logic low voltage during the preparing period F and remains at a logic high voltage during the first discharge period G and second discharge period H. The control voltage V_ctrl6 remains at a logic low voltage during the preparing period F and the first discharge period G and remains at a logic high voltage during the second discharge period H. As shown in FIG. 6, a portion of the erasion period C of the memory device overlaps the preparing period F so as to precharge the capacitor before the function of the discharge circuit 30. Thus, the control voltage V_ctrl3 and V_ctrl4 remain at a logic high voltage during the preparing period to turn on the transistor T31 and induce current I31 (as shown in FIG. 5) to flow from the voltage supplier VPASS to the connection node N2, and to turn on the transistor T32 and induce current I32 from the connection node N2 to the capacitor C. By turning on the transistors T31 and T32, the capacitor can be precharged to a voltage close to the voltage V_pass.

Figure 7:
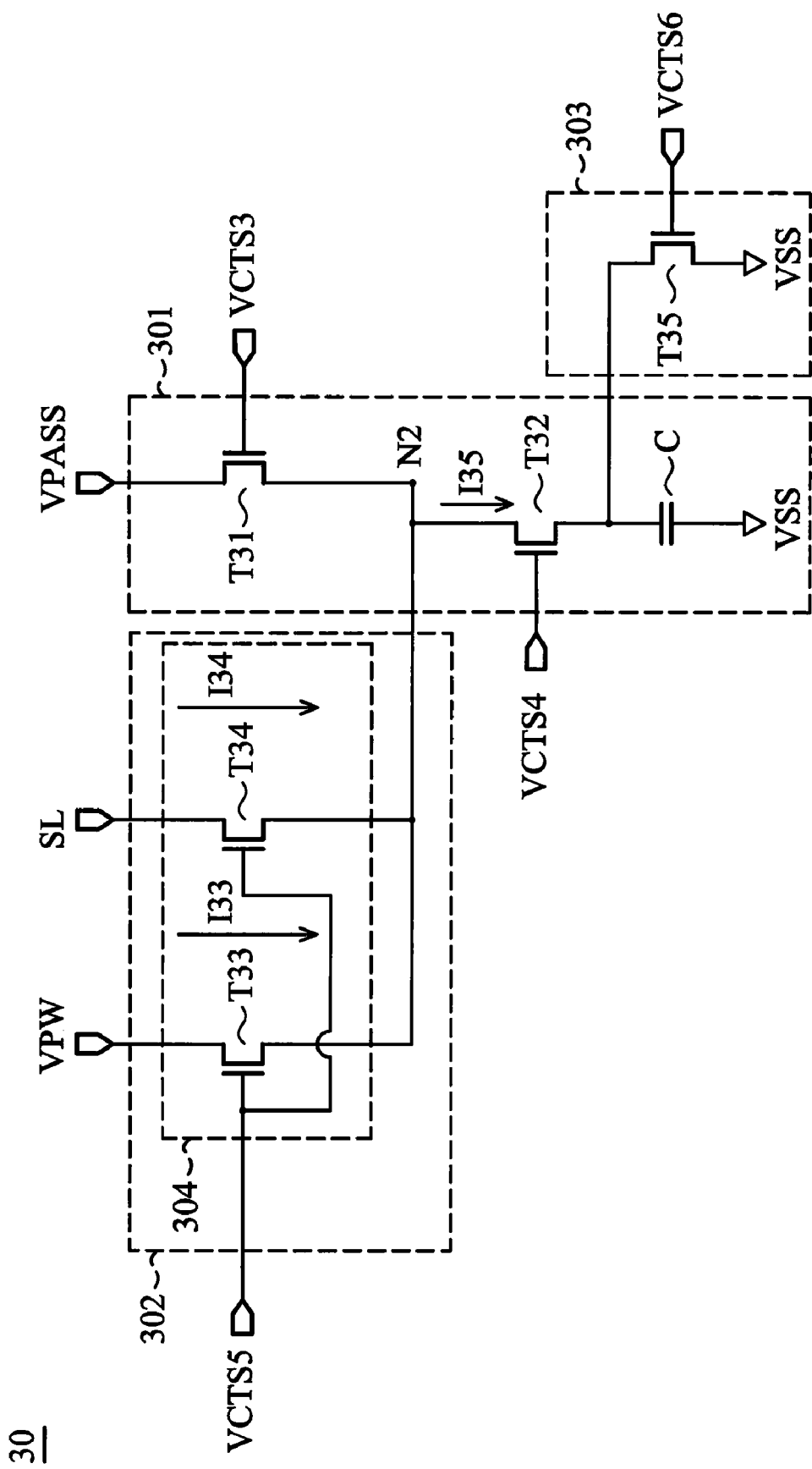
FIG. 7 shows the current flow of the discharge circuit 30 during the first discharge period.

FIG. 7 shows the current flow of the discharge circuit 30 during the first discharge period. According to the voltages shown in FIG. 6, the control voltage V_ctrl5 remains at a logic high voltage during the first discharge period to turn on the transistor T33 and induce a current I33 to flow from the well voltage line VPW to the connection node N2, and to turn on the transistor T34 and induce a current I34 to flow from the selection voltage line SL to the connection node N2. At this time, the control voltage supplier VCTS4 turns on the transistor T32 to induce a current I35 to flow from the connection node N2 to the capacitor C. Thus, during the first discharge period, the wall voltage line VPW and the selection voltage line SL may be coupled to the capacitor C by turning on the transistors T32, T33 and T34. Because now the capacitor C is charged to a voltage close to V_pass, the wall voltage line VPW and the selection voltage line SL may be discharged to a voltage substantially equal to the voltage V_pass during the first discharge period as shown in FIG. 6. According to the embodiment, the erasion voltage applied to the wall voltage line VPW during the erasion period is about 20V, a voltage smaller than 20V may be coupled on the selection voltage line SL and bit line BL, the voltage applied to the voltage line YBL may be 0V, and the voltage V_pass supplied by the voltage supplier VPASS may be 13V. Thus, during the first discharge period, the wall voltage line VPW, the selection voltage line SL and bit line BL may be discharged to a voltage about 13V, and since the voltage line Virpwr is connected to the connection node N2, the voltage on the voltage line Virpwr may be discharged to a voltage (10V in this embodiment) substantially equal to the voltage V_pass subtracted by the threshold voltage of the transistor T23. The values of the voltages have been described by way of examples and in terms of preferred embodiments, however it is to be understood that the invention is not limited thereto. The scope of the present invention shall be defined and protected by the following claims and their equivalents.

Figure 8:
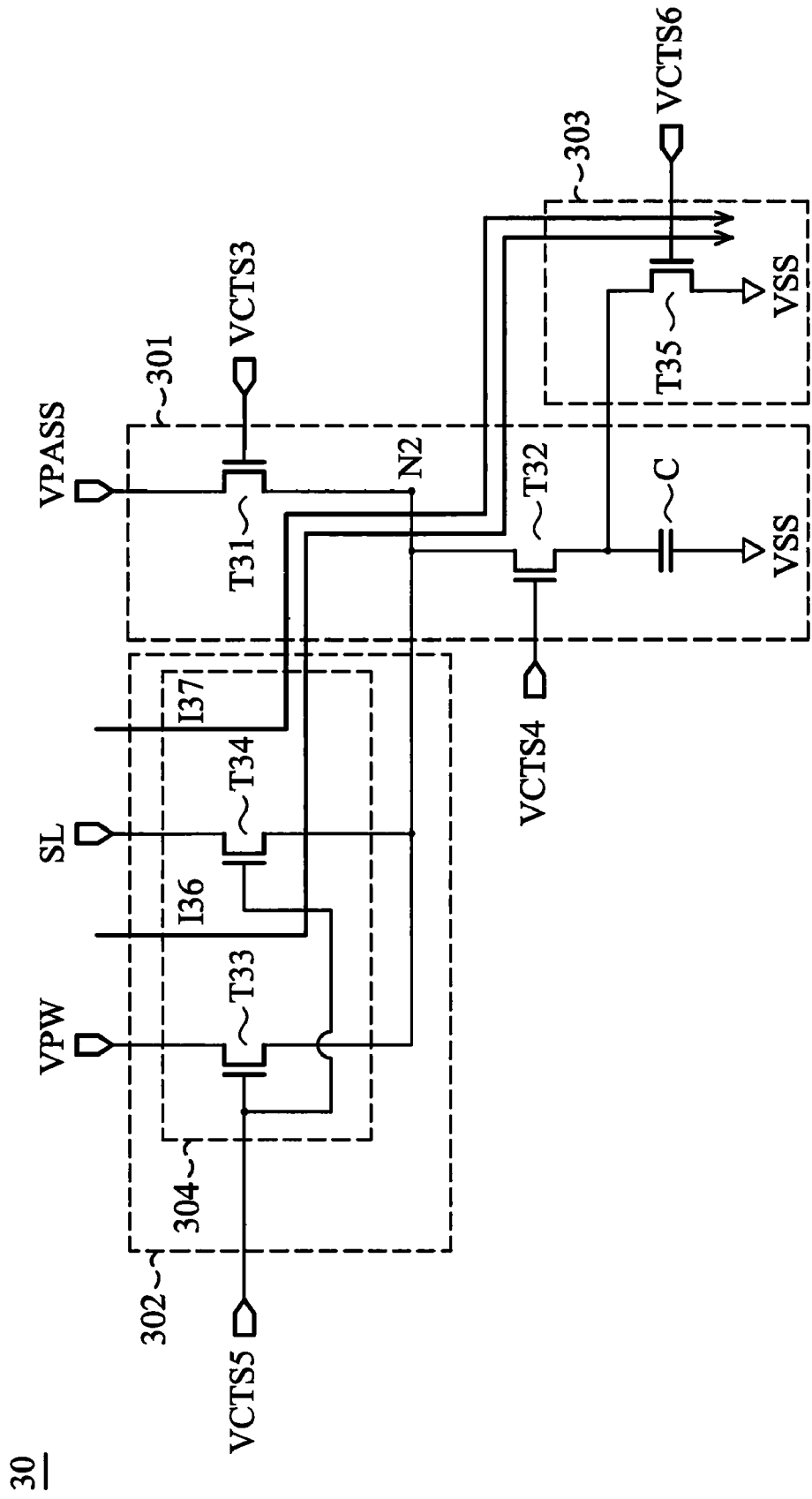
FIG. 8 shows the current flow of the discharge circuit 30 during the second discharge period.

FIG. 8 shows the current flow of the discharge circuit 30 during the second discharge period. According to the voltages shown in FIG. 6, the control voltages V_ctrl4, V_ctrl5 and V_ctrl6 remain at a logic high voltage during the second discharge period so as to turn on the transistors T32, T33, T34 and T35 and to induce currents I36 and I37. The current I36 flows from the well voltage line VPW through the transistors T33, T32 and T35 to the reference voltage VSS. The current I37 flows from the selection voltage line SL through the transistors T34, T32 and T35 to the reference voltage VSS. According to the embodiment, the reference voltage VSS may be the ground. Thus, during the second discharge period, the voltages on the well voltage line VPW, the selection voltage line SL, the bit line BL and the voltage line Virpwr may be further discharged to about 0V. According to the embodiment of the invention, the control voltage V_ctrl5 may remain at 8V~17V for a logic high voltage, or may be selected as half of the erasion voltage of the memory device for a logic high voltage.

According to the embodiments described above, the discharge circuits may adequately control the discharges of the voltage lines in the memory device, especially for discharging the erasion voltage of a NAND flash and a NOR flash. By simultaneously controlling the discharges of the voltage lines in the memory device, the problem of the different discharge speeds of the elements that induces large currents and conducts the PN junction may be solved. In addition, it is more preferable to use a medium voltage MOS transistor for the selection transistor. The discharges of the voltage lines of the memory device may be controlled within two periods via the discharge circuit to prevent the medium voltage MOS transistor from breaking down due to directly discharging the erasion voltage to a 0V.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An integrated circuit, comprising:
  a memory device, comprising;
    a memory cell;
    a well voltage line coupled to a well of the memory device;
    a first voltage line coupled to a first first node of the memory cell; and
    a first supplier supplying a first voltage to the well voltage line and coupling a coupled voltage on the first voltage line during an erasing period, wherein the first voltage is high enough to erase data stored in the memory cell; and
  a discharge circuit discharging the well voltage line and the first voltage line after the end of the erasing period, comprising:
    a first switch circuit coupled between the well voltage line, the first voltage line and a second supplier, wherein the second supplier supplies a second voltage smaller than the first voltage and the coupled voltage;
    a second switch circuit coupled between the first switch circuit and a reference voltage, wherein the reference voltage is smaller than the first voltage;
    a first control voltage supplier coupled to the first switch circuit and supplying a first control voltage to turn on the first switch circuit during a first discharge period so as to couple the well voltage line and the first voltage line to the second supplier; and
    a second control voltage supplier coupled to the second switch circuit and supplying a second control voltage to turn on the second switch circuit during a second discharge period so as to couple the well voltage line and the first voltage line to the reference voltage.

2. The integrated circuit as claimed in claim 1, wherein the first switch circuit comprises:
  a first transistor coupled to the well voltage line and comprising a first gate;
  a second transistor coupled to the first voltage line and comprising a second gate; and
  a third transistor coupled to the second supplier and comprising a third gate, wherein the first gate, the second gate, and the third gate are respectively coupled to the first control voltage supplier, and wherein the second switch circuit, the first transistor, the second transistor and the third transistor are coupled at a connection node.

3. The integrated circuit as claimed in claim 2, wherein the second switch circuit is a fourth transistor coupled between the connection node and the reference voltage, and comprises a fourth gate coupled to the second control voltage supplier.

4. The integrated circuit as claimed in claim 2, wherein the memory device further comprises:
  a bit line coupled to a first second node of the memory cell; and
  a fifth transistor comprising a fifth gate coupled to a selection voltage line, a second first node coupled to the bit line, and a second second node coupled to a source-drain voltage line, wherein the source-drain voltage line is further coupled to the connection node, and the selection voltage line is coupled to the first control voltage supplier.

5. The integrated circuit as claimed in claim 2, wherein during the first discharge period, the first transistor is turned on and induces a first current to flow from the well voltage line to the connection node, the second transistor is turned on and induces a second current to flow from the first voltage line to the connection node, and the third transistor is turned on and induces a third current to flow from the connection node to the second supplier.

6. The integrated circuit as claimed in claim 3, wherein during the second discharge period, the fourth transistor is turned on and induces a fourth current to flow from the connection node to the reference voltage.

7. The integrated circuit as claimed in claim 1, wherein the first control voltage remains at a logic high voltage during the first discharge period and the second discharge period, and wherein the second control voltage remains at a logic low voltage during the first discharge period and remains at a logic high voltage during the second discharge period.

8. The integrated circuit as claimed in claim 1, wherein the first control voltage is between 8 V-17 V.

9. The integrated circuit as claimed in claim 4, wherein the well voltage line, the first voltage line, the bit line and the source-drain voltage line remain at a voltage between the first voltage and the reference voltage during the first discharge period, and remain at a voltage substantially equal to the reference voltage during the second discharge period.

10. The integrated circuit as claimed in claim 1, wherein the memory device is a flash memory.

11. The integrated circuit as claimed in claim 4, wherein the fifth transistor is a medium voltage MOS transistor.

12. A discharge circuit discharging a plurality voltage lines in a memory device, wherein the voltage lines comprise a well voltage line coupled to a well of the memory device and a first voltage line coupled to a first first node of a memory cell of the memory device, wherein the memory device further comprises a first supplier supplying a first voltage high enough to erase data stored in the memory cell to the well voltage line and coupling a coupled voltage on the first voltage line during an erasing period, comprising:
   a preparing circuit comprising a second supplier, a first switch circuit coupled to the second supplier, a capacitor coupled to a reference voltage, and a second switch circuit coupled between the first switch circuit and the capacitor, wherein the second supplier supplies a second voltage to the first switch circuit, and the first switch circuit and the second switch circuit are turned on during a preparing period to charge the capacitor to the second voltage;
   a first stage discharge circuit comprising a third switch circuit coupled to the well voltage line and the first voltage line, wherein the third switch circuit, the first switch circuit and the second switch circuit are coupled at a connection node, and the third switch circuit is turned on during a first discharge period to couple the well voltage line and the first voltage line to the connection node; and
   a second stage discharge circuit comprising a fourth switch circuit coupled to the capacitor and the reference voltage, wherein the fourth switch circuit is turned on during a second discharge period to couple the connection node to the reference voltage.

13. The discharge circuit as claimed in claim 12, wherein the first switch circuit is a first transistor, the second switch circuit is a second transistor, the first transistor comprises a first gate coupled to a first control voltage, and the second transistor comprises a second gate coupled to a second control voltage.

14. The discharge circuit as claimed in claim 13, wherein the third switch circuit comprises a third transistor and a fourth transistor, the third transistor comprises a third gate coupled to a third control voltage, the fourth transistor comprises a fourth gate coupled to the third control voltage, and the first transistor, the second transistor, the third transistor and the fourth transistor are coupled to the connection node.

15. The discharge circuit as claimed in claim 14, wherein the fourth switch circuit is a fifth transistor comprising a fifth gate coupled to a fourth control voltage, wherein the first control voltage remains at a logic high voltage during the preparing period and remains at a logic low voltage during the first and second discharge periods, the second control voltage remains at a logic high voltage during the preparing period and the first and second discharge periods, the third control voltage remains at a logic low voltage during the preparing period and remains at a logic high voltage during the first and second discharge periods, and the fourth control voltage remains at a logic low voltage during the preparing period and the first discharge period and remains at a logic high voltage during the second discharge period.

16. The discharge circuit as claimed in claim 12, wherein the second voltage is smaller than the first voltage and the coupled voltage.

17. The discharge circuit as claimed in claim 13, wherein during the preparing period, the first transistor is turned on and induces a first current to flow from the second supplier to the connection node, and the second transistor is turned on and induces a second current to flow from the connection node to the capacitor.

18. The discharge circuit as claimed in claim 14, wherein during the first discharge period, the third transistor is turned on and induces a third current to flow from the well voltage line to the connection node, the fourth transistor is turned on and induces a fourth current to flow from the first voltage line to the connection node, and the second transistor is turned on and induces a fifth current to flow from the connection node to the capacitor.

19. The discharge circuit as claimed in claim 15, wherein during the second discharge period, the second transistor, the third transistor, the fourth transistor and the fifth transistor are turned on and induce a sixth current and a seventh current, wherein the sixth current flows through the third transistor, the second transistor and the fifth transistor to the reference voltage, and the seventh current flows through the fourth transistor, the second transistor and the fifth transistor to the reference voltage.

20. The discharge circuit as claimed in claim 14, wherein the memory device further comprises a selection transistor, a bit line, a source-drain voltage line and a selection voltage line, wherein the bit line is coupled between a first second node of the memory cell and a second first node of the selection transistor, the source-drain voltage line is couple to a second second node of the selection transistor, the selection voltage line is coupled to a sixth gate of the selection transistor, the source-drain voltage line is further coupled to the connection node, and the selection voltage line is further coupled to the third control voltage.

21. The discharge circuit as claimed in claim 20, wherein the well voltage line, the first voltage line, the bit line and the source-drain voltage line remain at a voltage between the first voltage and the reference voltage during the first discharge period, and remain at a voltage substantially equal to the reference voltage during the second discharge period.

22. The discharge circuit as claimed in claim 12, wherein the memory device is a flash memory.

23. The discharge circuit as claimed in claim 20, wherein the selection transistor is a medium voltage MOS transistor.

* * * * *